(12) United States Patent
Chang et al.

(10) Patent No.: US 7,032,087 B1
(45) Date of Patent: Apr. 18, 2006

(54) ERASE COUNT DIFFERENTIAL TABLE WITHIN A NON-VOLATILE MEMORY SYSTEM

(75) Inventors: Robert C. Chang, Danville, CA (US); Bahman Qawami, San Jose, CA (US); Farshid Sabet-Sharghi, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 243 days.

(21) Appl. No.: 10/696,228

(22) Filed: Oct. 28, 2003

(51) Int. Cl.
*G06F 12/00* (2006.01)

(52) U.S. Cl. ........................................ 711/156; 711/103

(58) Field of Classification Search ................ 711/103, 711/156; 365/218
See application file for complete search history.

(56) References Cited

U.S. PATENT DOCUMENTS

| | | | |
|---|---|---|---|
| 5,222,109 A | 6/1993 | Pricer | 377/24.1 |
| 5,297,148 A | 3/1994 | Harari et al. | 371/10.2 |
| 5,388,083 A | 2/1995 | Assar et al. | 365/218 |
| 5,406,529 A | 4/1995 | Asano | |
| 5,438,573 A | 8/1995 | Mangan et al. | 371/10.3 |
| 5,568,423 A | 10/1996 | Jou et al. | |
| 5,568,439 A | 10/1996 | Harari | 365/218 |
| 5,598,370 A | 1/1997 | Niijima et al. | 365/185.33 |
| 5,737,742 A | 4/1998 | Achiwa et al. | |
| 5,835,935 A | 11/1998 | Estakhri et al. | 711/103 |
| 5,845,313 A | 12/1998 | Estakhri et al. | 711/103 |
| 5,860,082 A | 1/1999 | Smith et al. | 711/103 |
| 5,907,856 A | 5/1999 | Estakhri et al. | 711/103 |
| 5,924,113 A | 7/1999 | Estakhri et al. | 711/103 |
| 5,930,193 A | 7/1999 | Achiwa et al. | 365/230.03 |
| 5,954,828 A | 9/1999 | Lin | |
| 5,956,473 A | 9/1999 | Ma et al. | |
| 5,963,473 A | 10/1999 | Norman | |
| 6,009,496 A | 12/1999 | Tsai | |
| 6,016,275 A | 1/2000 | Han | 365/185.29 |
| 6,081,447 A | 6/2000 | Lofgren et al. | 365/185.02 |
| 6,115,785 A | 9/2000 | Estakhri et al. | 711/103 |
| 6,125,435 A | 9/2000 | Estakhri et al. | 711/201 |

(Continued)

FOREIGN PATENT DOCUMENTS

EP 0 589 597 A2 3/1994

(Continued)

OTHER PUBLICATIONS

Kim, Jesung et al., "A Space-Efficient Flash Translation Layer for Compactflash Systems", IEEE Transactions on Consumer Electronics, vol. 48, No. 2, May 2002.

(Continued)

*Primary Examiner*—Kevin L. Ellis
(74) *Attorney, Agent, or Firm*—Anderson, Levine & Lintel

(57) ABSTRACT

Methods and apparatus for efficiently tracking the usage of physical blocks of non-volatile memory are disclosed. According to one aspect of the present invention, a method for maintaining a data structure that stores contents relating to the usage of physical blocks includes determining when to update the contents stored in the data structure, and obtaining a first differential erase count from the data structure when the contents are to be updated. The first differential erase count provides information on a number of times a first physical block has been erased. The method also includes determining a first actual erase count when the contents are to be updated. The first actual erase count is associated with a second physical block, and provides a number of times the second physical block has been erased. Finally, the method includes updating the first differential erase count when the contents are to be updated.

34 Claims, 5 Drawing Sheets

U.S. PATENT DOCUMENTS

| | | | |
|---|---|---|---|
| 6,226,759 B1 | 5/2001 | Miller et al. | |
| 6,230,233 B1 | 5/2001 | Lofgren et al. | 711/103 |
| 6,260,156 B1 | 7/2001 | Garvin et al. | 714/8 |
| 6,282,605 B1 | 8/2001 | Moore | |
| 6,381,176 B1 | 4/2002 | Kim et al. | |
| 6,426,893 B1 | 7/2002 | Conley et al. | 365/185.11 |
| 6,523,132 B1 | 2/2003 | Harari et al. | |
| 6,604,168 B1 | 8/2003 | Ogawa | |
| 6,683,817 B1 | 1/2004 | Wei et al. | |
| 6,694,402 B1 | 2/2004 | Muller | |
| 6,732,221 B1 | 5/2004 | Ban | |
| 6,741,486 B1 | 5/2004 | Sakui | |

FOREIGN PATENT DOCUMENTS

| | | |
|---|---|---|
| JP | 62-283496 | 12/1987 |
| JP | 62-283497 | 12/1987 |
| WO | WO 00/14641 | 3/2000 |

OTHER PUBLICATIONS

Chiang et al., "Managing Flash Memory in Personal Communication Devices", International Symposium on Consumer Electronics (IEEE, 1997), pp. 177-182.

Chang et al., "An Adaptive Striping Architecture for Flash Memory Storage Systems of Embedded Systems", 8th Real-Time and Embedded Tech. and Appl. Symp.(IEEE, Sep. 24, 2002).

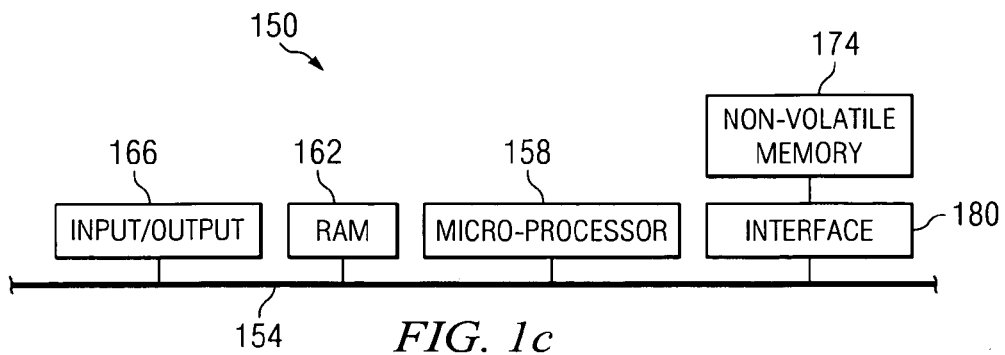
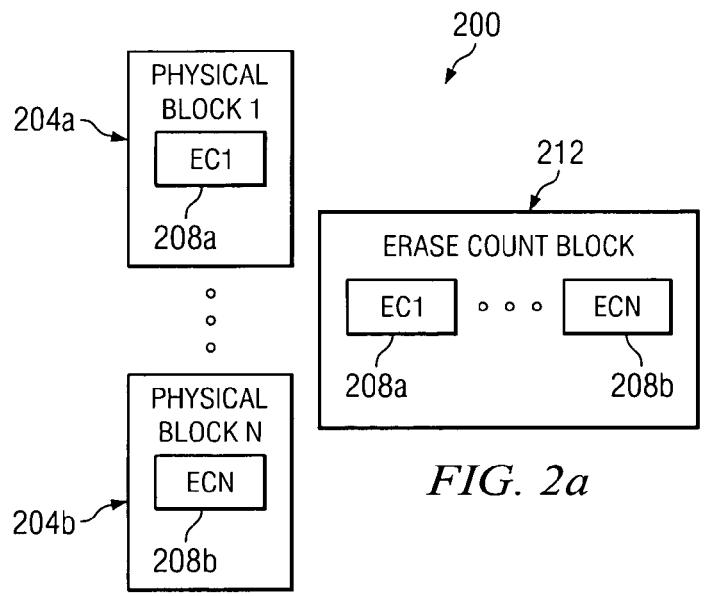
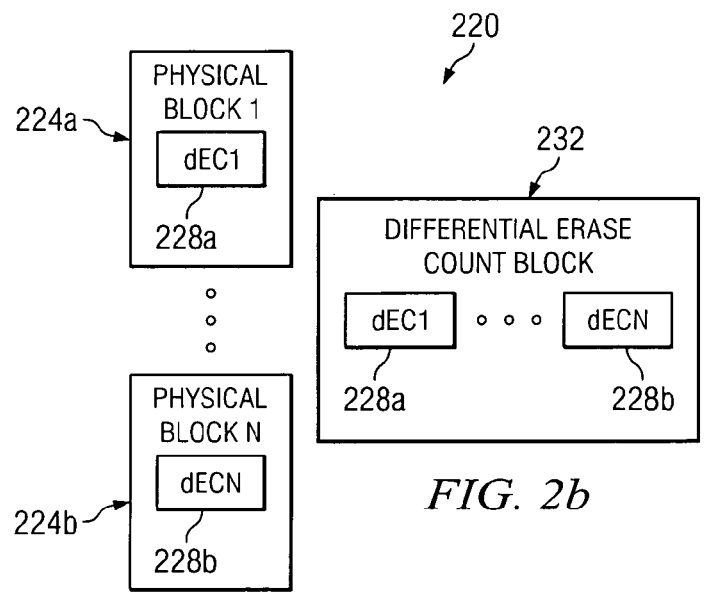

ERASE COUNT DIFFERENTIAL TABLE WITHIN A NON-VOLATILE MEMORY SYSTEM

CROSS REFERENCE TO RELATED APPLICATIONS

The present invention is related to co-pending U.S. patent application Ser. Nos. 10/281,739, 10/281,823, 10/281,670, 10/281,824, 10/281,631, 10/281,855, 10/281,762, 10/281,696, 10/281,626, and 10/281,804, as well as co-pending U.S. Provisional Patent Application Nos. 60/421,910, 60/421,725, 60/421,965, 60/422,166, 60/421,746, and 60/421,911, each filed on Oct. 28, 2002, and to co-pending U.S. patent application Ser. No. 10/696,229, filed concurrently herewith, which are each incorporated herein by reference in their entireties.

BACKGROUND OF THE INVENTION

1. Field of Invention

The present invention relates generally to mass digital data storage systems. More particularly, the present invention relates to systems and methods for efficiently utilizing memory by simplifying the process of tracking the number of times physical memory blocks have been erased.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Since resources such as the amount of available memory space in a flash memory storage system are often limited, the efficient usage of memory within the system is critical. By way of example, within flash memory storage systems, bytes within physical blocks may be allocated to store particular information such as erase counts which effectively keep track of the number of times physical blocks have been erased, as described in co-pending U.S. patent application Ser. No. 10/281,696, which has been incorporated by reference. Reading and storing erase counts, both within individual physical blocks and within an erase count block, may sometimes consume relatively significant resources and a relatively significant amount of time. An erase count block is described in co-pending U.S. patent application Ser. No. 10/281,626, which has been incorporated by reference.

In many systems, as for example systems in which binary or MLC NAND memory may be erased up to approximately one hundred thousand times, approximately three bytes may be needed to store an erase count within an associated physical block and three bytes may be needed to store an erase count in an erase count block. The use of three bytes to store an erase count in an associated physical block and three bytes to store an erase count in an erase count block, while effective, may be a relatively complicated process in some instances, as many systems are not capable of efficiently reading three bytes. For example, some systems may not be able to read three bytes in one process or step, and may instead only enable either one, two, or four bytes to be read in one process or step. In such systems, the reading of three bytes generally entails first reading one byte and then reading the next two bytes, or reading four bytes then disregarding one byte that was read. Such reading processes may be relatively time consuming.

Therefore, what is desired is a process and a system which allows resources within a flash memory system to be efficiently used. Specifically, what is needed is a process and a system which allows the number of bits used to store erase counts to be reduced to increase the efficiency of a flash memory system.

SUMMARY OF THE INVENTION

The present invention relates to a system and a method that maintains differential erase counts within individual physical blocks and within an erase count table. According to one aspect of the present invention, a method for maintaining a data structure that stores contents relating to the usage of physical blocks included in a non-volatile memory system includes determining when it is appropriate to update the contents stored in the data structure, and obtaining a first differential erase count from the data structure when it is determined that it is appropriate to update the contents stored in the data structure. The first differential erase count is a plurality of bits arranged to provide information relating to a number of times a first physical block has been erased. The method also includes determining a first actual erase count when it is determined that it is appropriate to update the contents stored in the data structure. The first actual erase count is associated with a second physical block of the plurality of physical blocks, and is a plurality of bits arranged to provide a number of times the second physical block has been erased. Finally, the method includes updating the first differential erase count using the first actual erase count when it is determined that it is appropriate to update the contents stored in the data structure.

In one embodiment, the method also includes identifying a first stored actual erase count associated with the non-volatile memory system when it is determined that it is appropriate to update the contents stored in the data structure. In such an embodiment, updating the first differential erase count when it is determined that it is appropriate to update the contents stored in the data structure includes processing the first differential erase count, the first actual erase count, and the first stored actual erase count to create the updated first differential erase count.

The use of differential erase counts in lieu of actual, or absolute, erase counts to keep track of the number of times physical blocks have been erased generally serves to reduce the number of bits used to store information relating to the number of times physical blocks have been erased. Reducing the number of bits needed to store such information frees up memory space within a memory system for other purposes, and also may decrease the amount of time and resources needed to read and write the erase count information. As a result, the performance of the memory system may be improved by using fewer bits to store erase count information, i.e., by storing erase count information as differential erase counts.

According to another aspect of the present invention, a method for tracking the life remaining for a first physical block included in a non-volatile memory system includes obtaining a differential erase count associated with the first physical block, incrementing the differential erase count, and storing the differential erase count. The differential erase count substantially expresses a difference between a number of times the first physical block has been erased and a first value, which may be a lowest actual erase count associated with a least erased physical block in the memory system.

In one embodiment, the method also includes obtaining an average erase count associated with the non-volatile memory system that indicates an average number of times physical blocks has been erased, and comparing the average erase count with a second value to determine when the average erase count is substantially equal to the second value. When it is determined that the average erase count is substantially equal to the second value, the method still further includes updating the differential erase count after the differential erase count is obtained.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIG. 1b is a diagrammatic representation a memory device, e.g., memory device 120 of FIG. 1a.

FIG. 1c is a diagrammatic representation of a host system which includes an embedded non-volatile memory.

FIG. 2a is a diagrammatic representation of a memory system which includes an erase count block and physical blocks which include erase counts.

FIG. 2b is a diagrammatic representation of a memory system which includes a differential erase count block and physical blocks which include differential erase counts in accordance with an embodiment of the present invention.

DETAILED DESCRIPTION OF THE EMBODIMENTS

Within a non-volatile memory system, the efficient allocation of resources is critical to ensure that the performance of the system meets or exceeds acceptable standards. By efficiently using memory resource within a system, the amount of memory available for use in storing data or information may generally be increased. For example, if the number of bits used to store erase counts in physical blocks and an erase count block, which are described in more detail in co-pending U.S. patent application Ser. Nos. 10/281,626 and 10/281,696 which have each been incorporated by reference, may be reduced, then more memory space may be available for use in storing user data.

In addition to reducing the number of bits used to store erase count information in order to free up memory space within a system for other purposes, reducing the amount of memory space occupied by erase count information typically decreases the amount of time and resources needed to read and write the erase count information, as fewer bits would need to be read and written. Hence, the performance of the system may be improved by using fewer bits to store erase count information. The number of bits needed to store erase count information may be reduced by storing "partial" information related to actual erase counts. In one embodiment, rather than storing an actual erase count, partial or differential erase count information may be stored using fewer bits than typically needed to store an actual erase count. Differential erase count information may effectively express the difference between an actual erase count and a "base" value, which may be the lowest erase count associated with the system. By essentially subtracting the base value from an actual erase count to create a differential erase count, the number of bits needed to express erase count information may generally be reduced.

Figure 1A:
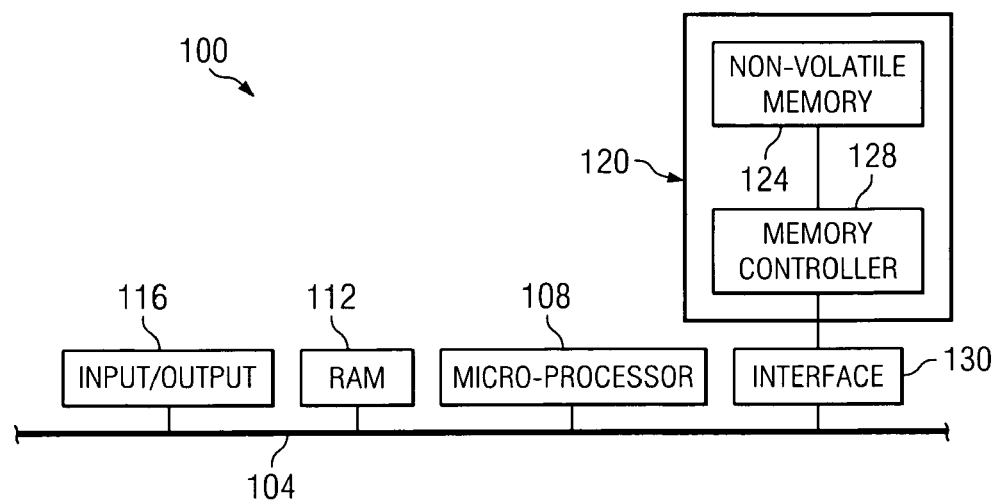
FIG. 1a is a diagrammatic representation of a general host system which includes a non-volatile memory.

Flash memory systems or, more generally, non-volatile memory devices which may use differential erase counts and a differential erase count block or table generally include flash memory cards and chip sets. Typically, flash memory systems are used in conjunction with a host system such that the host system may write data to or read data from the flash memory systems. However, some flash memory systems include embedded flash memory and software which executes on a host to substantially act as a controller for the embedded flash memory, as will be discussed below with respect to FIG. 1c. Referring to FIG. 1a, a general host system which includes a non-volatile memory device, e.g., a CompactFlash memory card or substantially any type of memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

Host system 100 may also be a system which either only captures data, or only retrieves data. That is, host system 100 may be, in one embodiment, a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional interface block 130 may allow non-volatile memory device 120 to interface indirectly with bus 104. When present, input/output circuit block 116 serves to reduce loading on bus 104, as will be understood by those skilled in the art. Non-volatile memory device 120 includes non-volatile memory 124 and an optional memory control system 128. In one embodiment, non-volatile memory device 120 may be implemented on a single chip or a die. Alternatively, non-volatile memory device 120 may be implemented on a multi-chip module, or on multiple discrete components which may form a chip set and may be used together as non-volatile memory device 120. One embodiment of non-volatile memory device 120 will be described below in more detail with respect to FIG. 1b.

Non-volatile memory 124, e.g., flash memory such as NAND flash memory, is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128 or, when memory control system 128 is not present, by software executed by microprocessor 108. The operation of non-volatile memory 124 may be managed such that the lifetime of non-volatile memory 124 is substantially maximized by essentially causing sections of non-volatile memory 124 to be worn out substantially equally.

Non-volatile memory device 120 has generally been described as including an optional memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Alternatively, the functionality of memory control system 128 may be provided by microprocessor 108, as for example in an embodiment in which non-volatile memory device 120 does not include memory controller 128, as discussed above.

Figure 1B:
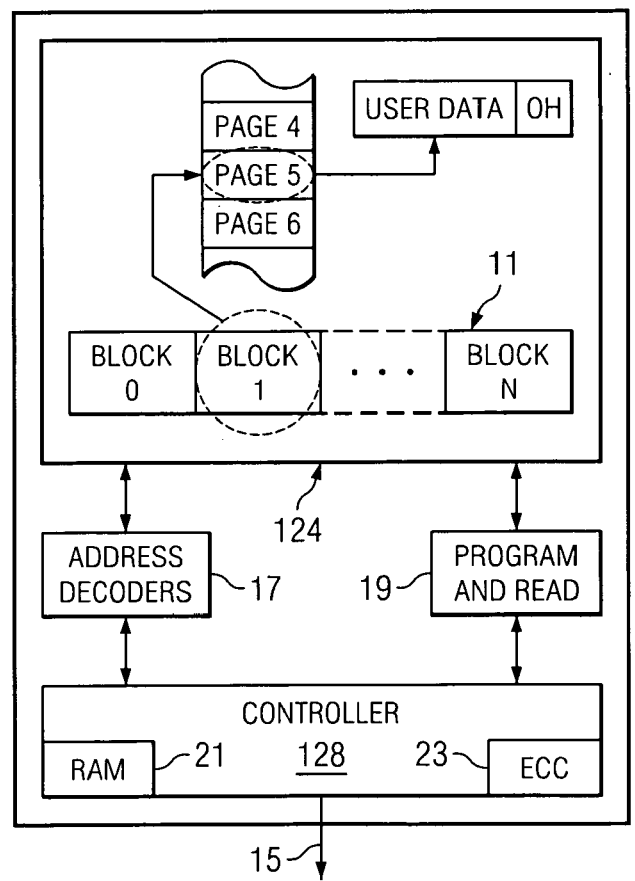

With reference to FIG. 1b, non-volatile memory device 120 will be described in more detail in accordance with an embodiment of the present invention. As described above, non-volatile memory device 120 includes non-volatile memory 124 and may include memory control system 128.

Memory 124 and control system 128, or controller, may be primary components of non-volatile memory device 120, although when memory 124 is an embedded NAND device, for example, non-volatile memory device 120 may not include control system 128. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

When present, control system 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 or microprocessor 108 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0–N memory cells. As is common for flash EEPROM systems, the block is typically the smallest unit of erase. That is, each block contains the minimum number of memory cells that are erased together. Each block is typically divided into a number of pages. As will be appreciated by those skilled in the art, a page may be the smallest unit of programming. That is, a basic programming operation writes data into or reads data from a minimum of one page of memory cells. One or more sectors of data are typically stored within each page. As shown in FIG. 1b, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data, or redundant data, is typically an additional 16 bytes. One sector of data is most commonly included in each page but two or more sectors may instead form a page. Any number of pages may generally form a block. By way of example, a block may be formed from eight pages up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

In one embodiment, non-volatile memory is embedded into a system, e.g., a host system. Flash memory chip sets generally include flash memory components and a controller component. Typically, a flash memory chip set may be arranged to be assembled into an embedded system. The manufacturers of such assemblies or host systems typically acquire flash memory in component-form, as well as other components, then assemble the flash memory and the other components into a host system.

FIG. 1c is a diagrammatic representation of a host system which includes an embedded non-volatile memory. A host or computer system 150 generally includes a system bus 154 which allows a microprocessor 158, a RAM 162, and input/output circuits 166, among other components (not shown) of host system 150, to communicate. A non-volatile memory 174, e.g., a flash memory, allows information to be stored within host system 150. An interface 180 may be provided between non-volatile memory 174 and bus 154 to enable information to be read from and written to non-volatile memory 174.

Non-volatile memory 174 may be managed by microprocessor 158 which effectively executes either or both software and firmware which is arranged to control non-volatile memory 174. That is, microprocessor 158 may run code devices (not shown), i.e., software code devices or firmware code devices, which allow non-volatile memory 174 to be controlled. Such code devices, which may be a flash memory packaged with CPU inside microprocessor 158, a separate flash ROM, or inside non-volatile memory 174, which will be described below, may enable physical blocks in non-volatile memory 174 to be addressed, and may enable information to be stored into, read from, and erased from the physical blocks.

Erase counts are generally maintained to enable the wear of a physical block to be readily determined, and to facilitate wear leveling processes. As described in more detail in co-pending U.S. patent application Ser. No. 10/281,696, which has been incorporated by reference, each usable physical block may have an associated erase count which is incremented each time the physical block is erased. Hence, the erase count associated with a physical block is indicative of the number of write and erase cycles which the physical block has been through, and provides a measure which enables the remaining lifetime of the physical block to be estimated. In general, the erase count associated with a physical block is stored in that physical block, as well as in an erase count block, each time the erase count is incremented, as described in more detail in co-pending U.S. patent application Ser. Nos. 10/281,626 and 10/281,696, which have each been incorporated by reference.

FIG. 2a is a diagrammatic representation of a non-volatile memory system which includes an erase count block and physical blocks which include erase counts. A memory system 200 includes physical blocks 208 which are arranged to store data. Within physical blocks 208, erase counts 204 are stored, e.g., in redundant areas associated with physical blocks 208. Erase counts 208 are also stored in an erase count block 212. Erase count 208a is arranged to indicate a number of times physical block 204a has been erased, while erase count 208b is arranged to indicate a number of times physical block 204b has been erased. By storing erase counts 208 in physical blocks 204, when a physical block 204 is accessed, its corresponding level of wear may be readily determined by reading its associated erase count 208. The storage of erase counts 208 in erase count block 212 allows all erase counts 208 to be readily obtained by reading erase count block 212, thereby facilitating, for example, the calculation of an average erase count and the identification of the least erased physical blocks 204 within system 200.

An erase count 208 generally occupies up to three bytes in a physical block 204 and up to three bytes in erase count block 212. More specifically, three bytes in a physical block 204 and three bytes in erase count block 212 are typically reserved to accommodate an erase count 208. Maintaining erase count 208 in erase count block 212 allows erase count 208 to be accessible even when it is not possible to obtain erase count 208 from physical block 204. In order to conserve memory space and, as a result, allow physical memory resources to be used efficiently, the number of bytes used to store erase count information may be reduced by storing differential erase counts rather than actual erase counts in physical blocks and in an erase count block, i.e., a differential erase count block. A differential erase count for a physical block may be the difference between an actual erase count for the physical block and a specified value, e.g., the lowest actual erase count associated with an overall non-volatile memory system. Since wear leveling processes, e.g., wear leveling processes as described in co-pending U.S. patent application Ser. No. 10/281,739 which has been incorporated by reference, effectively ensure that the lowest erase count in an overall non-volatile memory system is generally not significantly lower than the highest erase count in the system, fewer than three bytes may be allocated to store a differential erase count. For example, a differential erase count may be stored as two or fewer bytes, which typically serves to provide additional space in physical blocks and to reduce the size of a table or a block, i.e., a differential erase count block, that stores substantially all differential erase counts associated with a system.

With reference to FIG. 2b, a non-volatile memory system which uses differential erase counts and includes a differential erase count block will be described in accordance with an embodiment of the present invention. A memory system 220 includes physical blocks 224 and a differential erase count block 232. Differential erase counts 228 are stored in their corresponding physical blocks 224, e.g., differential erase count 228a is stored in physical block 224a while differential erase count 228b is stored in physical block 224b. Differential erase counts 228 are also stored in differential erase count block 232.

As mentioned above, differential erase counts 228 may be stored using fewer bytes than actual erase counts, e.g., erase counts 208 of FIG. 2a. Three bytes are generally allocated to store erase counts 208, since erase counts 208 generally each include approximately seventeen or eighteen bits, although erase counts 208 may each include more than eighteen bits. However, since differential erase counts 228 may typically each be expressed using sixteen or fewer bits, substantially only two bytes may be allocated to store each erase count 228. Although lower erase counts 208 may include less than two bytes, when erase counts 208 are higher in value, erase counts 208 may occupy up to approximately three bytes. Hence, in one embodiment, erase counts 208 may be stored until such time as erase counts 208 may generally require more than a certain number of bytes, e.g., more than approximately two bytes, at which time erase counts 208 may effectively be replaced by differential erase counts 228.

Figure 3:
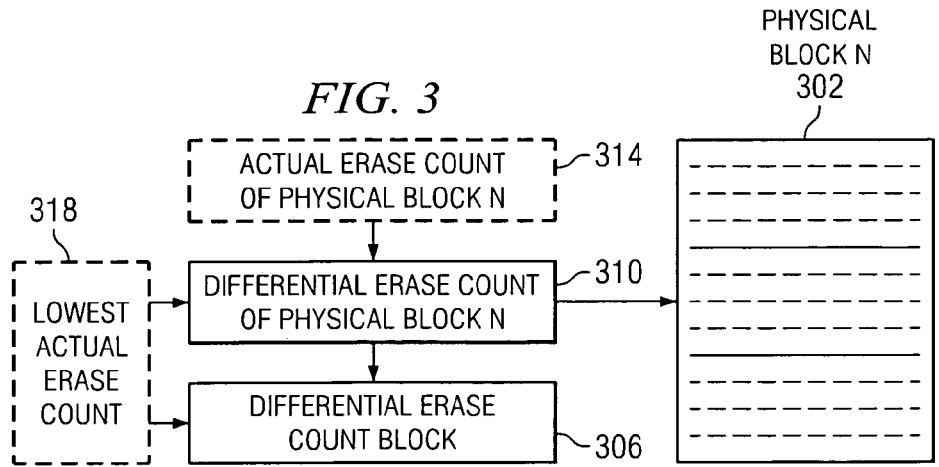
FIG. 3 is a diagrammatic representation of a process of determining a differential erase count and storing the differential erase count in accordance with an embodiment of the present invention.

FIG. 3 is a block diagram representation of a process of updating a differential erase count and a differential erase count block in accordance with an embodiment of the present invention. A differential erase count 310 of a physical block 'N' 302 is generally incremented each time physical block 'N' 302 is erased, and may be updated at substantially any time during the lifetime of a memory system which includes physical block 'N' 302, although the number of times differential erase count 310 is updated may often be effectively minimized. Differential erase count 310 is generally the difference between an actual erase count 314 associated with physical block 'N' 302 and a base value, e.g., the lowest actual erase count 318 associated with the overall memory system. It should be appreciated that "updating" differential erase count 310 generally refers to changing differential erase count 310 such that differential erase count 310 effectively reflects a new base value. In other words, updating differential erase count 310 typically refers to modifying differential erase count 310 to account for a new base value or, in the described embodiment, an updated lowest erase count 318.

Differential erase count 310, once updated, may be stored into both physical block 'N' 302 and differential erase count block 306. In one embodiment, lowest actual erase count 318 may also be stored into differential erase count block 306. Lowest actual erase count 318 is generally the lowest absolute erase count associated with substantially any physical block in the overall memory system.

Figure 4:
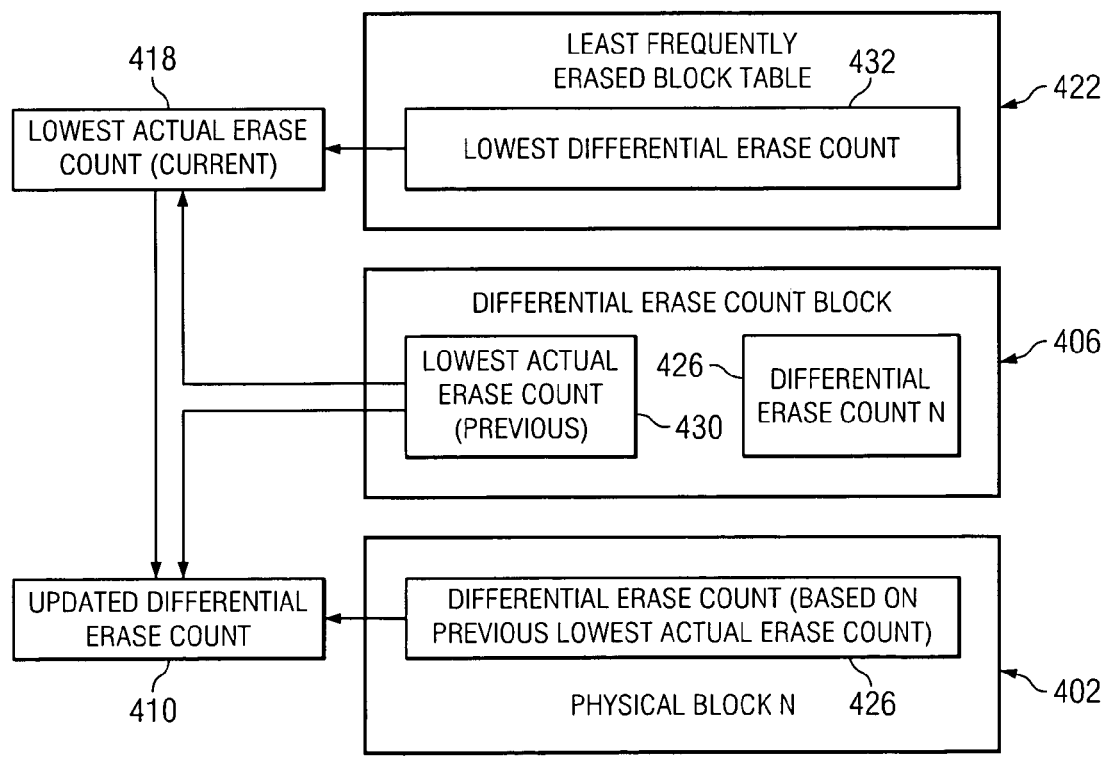
FIG. 4 is a diagrammatic representation of a process of updating a differential erase count in accordance with an embodiment of the present invention.

In order to actually determine an updated differential erase count 310, in addition to obtaining lowest actual erase count 318, the differential erase count stored in physical block 'N' 302 at the onset of the updating process is also obtained. FIG. 4 is a block diagram representation of a process of determining an updated differential erase count in accordance with an embodiment of the present invention. A least frequently erased block table 422 generally contains a lowest differential erase count 432 within a memory system or, more specifically, references to the block within the memory system which is associated with lowest differential erase count 432.

A previous lowest actual erase count 430 is stored in a differential erase count block 406, as for example when the memory system is powered down, and reflects the lowest actual erase count 430 that was stored in differential erase count block 406 prior to a current update process. A least frequently erased block table is described in co-pending U.S. patent application Ser. No. 10/281,824, which has been incorporated by reference. Using previous lowest actual erase count 430 and lowest differential erase count 432, the current lowest actual erase count 418 may be determined, e.g., by adding lowest differential erase count 432 and previous lowest actual erase count 430.

A differential erase count 426 for a physical block 'N' 402, which is based on previous lowest actual erase count 430 is typically stored in both physical block 'N' 402 and in differential erase count block 406. It should be appreciated, however, that as long as differential erase count 426 is available in differential erase count block 406, it may not be necessary to always store a most recent differential erase count 426 in physical block 'N' 402, since differential erase count 426 may be obtained from differential erase count block 406. Hence, when differential erase count 426 is to be obtained, differential erase count 426 may typically be obtained from differential erase count block 406.

In order to determine an updated differential erase count 410 which corresponds to physical block 'N' 402, differential erase count 426 which is based on previous lowest actual erase count 430, previous lowest actual erase count 430, and current lowest actual erase count 418 may be processed. Updated differential erase count 410 effectively reflects a difference between current lowest actual erase count 418 and the actual erase count associated with physical block 'N' 402.

Figure 5:
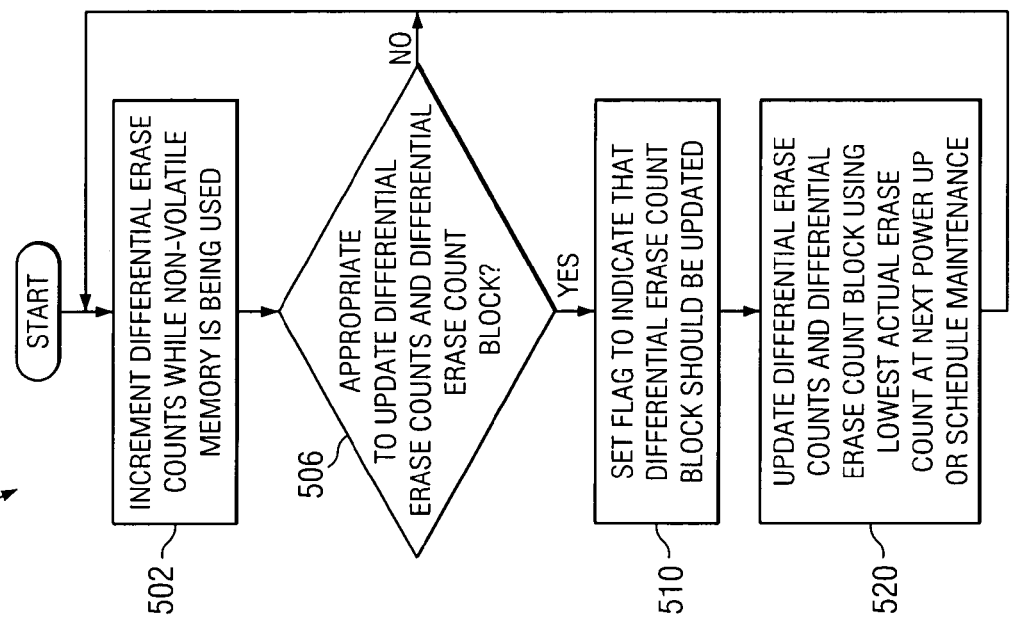
FIG. 5 is a process flow diagram which illustrates the steps associated with one general method of utilizing a non-volatile memory system which includes a differential erase count table in accordance with an embodiment of the present invention.

Referring next to FIG. 5, the steps associated with one general method of utilizing a non-volatile memory which includes utilizing a differential erase count table will be described in accordance with an embodiment of the present invention. A process 500 of utilizing a non-volatile memory begins at step 502 in which differential erase counts are incremented while the non-volatile memory is in used. As previously discussed, a differential erase count is incremented when a physical block associated with the differential erase count is erased. The incremented differential erase count is then typically stored in its associated physical block, as well as in a differential erase count block. At some point, e.g., periodically or upon powering up the overall non-volatile memory system, it is determined in step 506 whether it is appropriate to update the differential erase counts and the differential erase count block in the system. That is, it is determined if the differential erase counts stored in associated physical blocks and in the differential erase count block are to be substantially "reset" to account for the new, current lowest actual erase count.

A determination of whether to update differential erase counts and, additionally, the differential erase count block may be based upon substantially any suitable criterion. In one embodiment, the criterion may be based upon an average erase count associated with the non-volatile memory. For example, updating may occur when the average erase count is substantially equal to particular threshold values. Hence, it may be determined to be appropriate to update differential erase counts and the differential erase count block when the average erase count is equal to a particular threshold value.

If it is determined in step 506 that it is not appropriate to update the differential erase counts and the differential erase count block, then process flow returns to step 502 in which the differential erase counts are incremented while the non-volatile memory is being used. Alternatively, if it is determined in step 506 that updating the differential erase counts and the differential erase count block is appropriate, then a flag is set to indicate the differential erase count block and, hence, differential erase counts and, hence, should be updated. In one embodiment, such a flag may be stored in a power management block which is described in co-pending U.S. Provisional Patent Application No. 60/422,177, which has been incorporated by reference.

Once the flag that indicates that the differential erase count block should be updated, the differential erase counts may continue to be incremented while the non-volatile memory is being used. Then, when the next scheduled maintenance procedure or power up occurs, the differential erase counts and the differential erase count block are updated using the lowest actual erase count associated with the non-volatile memory in step 520. A scheduled maintenance procedure, which is described in co-pending U.S. patent application Ser. No. 10/696,229, which has been incorporated by reference, effectively enables a power up process to be substantially simulated such that maintenance procedures may substantially periodically performed even when there are no power up processes occurring. The maintenance procedures may include updating differential erase counts and a differential erase count block. Updating the differential erase counts typically includes substantially basing the differential erase counts on a new "base value," e.g., the most current lowest actual erase count within the system, and storing the differential erase counts in their associated physical blocks and in the differential erase count block. Once the differential erase counts are updated, process flow returns to step 502 in which the differential erase counts are incremented while the non-volatile memory is being used.

As previously mentioned, in one embodiment, thresholds may be used to determine when it is appropriate to update differential erase counts and a differential erase count block based on an average erase count. Often, it may be desirable to minimize the occurrence of updating processes insofar as possible, since the updating processes may be relatively time consuming. By way of example, when a non-volatile memory has a projected lifetime of up to approximately one hundred thousand cycles, i.e., write and erase cycles, approximately two updating processes may occur during the lifetime of the non-volatile memory. Such updating processes may occur when the average erase count has a value that is substantially equal to a threshold that has a value of one-third of the projected lifetime of the non-volatile memory and when the average erase count has a value that is substantially equal to a threshold that has a value of two-thirds of the projected lifetime, although it should be appreciated that both the threshold values and the number of updating processes may vary widely.

Figure 6:
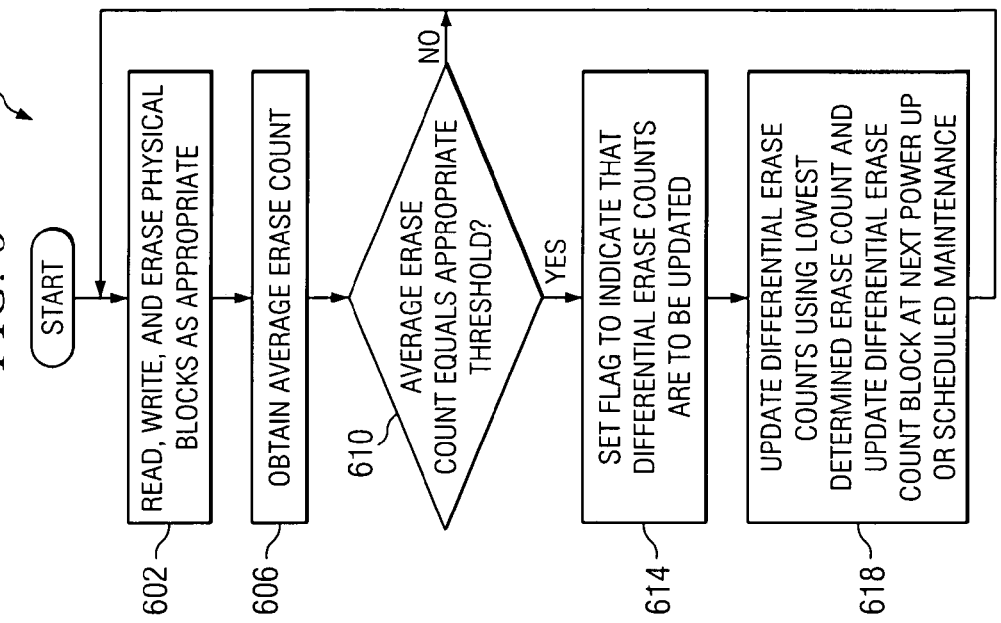
FIG. 6 is a process flow diagram which illustrates the steps associated with one particular method of utilizing a non-volatile memory system which includes a differential erase count table in accordance with an embodiment of the present invention.

FIG. 6 is a process flow diagram which illustrates the steps associated with one particular method of utilizing a non-volatile memory which includes using an average erase count as a barometer in accordance with an embodiment of the present invention. A process 600 of utilizing a non-volatile memory begins at step 602 in which physical blocks are read, written, and erased as appropriate. An average erase count is then obtained in step 606. In one embodiment, the average erase count is stored in a differential erase count block, although it should be appreciated that the average erase count may be stored or written into substantially any data structure in NAND memory associated with the structure. The average erase count may be obtained at substantially any time. By way of example, the average erase count may be obtained each time it is updated, the average erase count may be obtained each time a certain number of erase processes has occurred, or the average erase count may be obtained each time a predetermined amount of time has elapsed.

Once the average erase count is obtained, it is determined in step 610 if the average erase count substantially equals an appropriate comparison value or threshold. It should be appreciated that the both the number of thresholds and the values of thresholds to which the average erase count is compared may vary widely. For instance, appropriate thresholds may include, but are not limited to, values corresponding to approximately one third of a lifetime of the overall non-volatile memory system and approximately two thirds of the lifetime of the overall non-volatile memory system. When the expected lifetime of the overall non-volatile memory is approximately one hundred thousand cycles, appropriate comparison values, e.g., thresholds, may include values of approximately 33,000 and approximately 66,000. The appropriate thresholds may be stored or otherwise maintained substantially anywhere within the overall non-volatile memory, e.g., in a differential erase count block.

If it is determined in step 610 that the average count is not substantially equal to an appropriate threshold, the indication is that it is not necessary to update differential erase counts and a differential erase count block. As such, process flow returns to step 602 in which physical blocks continue to be read, written, and erased as appropriate. Alternatively, if it is determined in step 610 that the average erase count is substantially equal to an appropriate threshold, then the indication is that differential erase counts and a differential erase count block are to be updated. Accordingly, in step 614, a flag that indicates that a differential erase count block and, hence, differential erase counts, is set to indicate that the differential erase count block is to be updated. As previously mentioned, such a flag may be stored in a power management block.

Once the flag is set to indicate that a differential erase count block is to be updated, e.g., updated based on a new base value, the non-volatile memory continues to be used, and the differential erase counts continue to be incremented as appropriate, until a power up process or a scheduled maintenance process occurs. In step 618, when a power up or scheduled maintenance occurs, differential erase counts and the differential erase count block are updated using the new base value which is often the lowest determined erase count in the non-volatile memory system. The lowest determined erase count may generally be the "absolute" or actual "undifferential" value of the lowest erase count. After the updating occurs, process flow returns to step 602 in which physical blocks are read from, written to, and erased as appropriate.

Although a differential erase count block may be updated at substantially any time, i.e., an erase count block may be changed from storing actual erase counts to storing differential erase count blocks at substantially any time or the base value used to determine differential erase counts in the differential erase count block may be changed at substantially any time, since updates may be relatively time-consuming, updates may effectively be scheduled. By way of example, as discussed above, differential erase counts and a differential erase count block may be updated when a power up process occurs, or during a scheduled maintenance procedure, since updating processes are generally a relatively rare occurrence.

Figure 7:
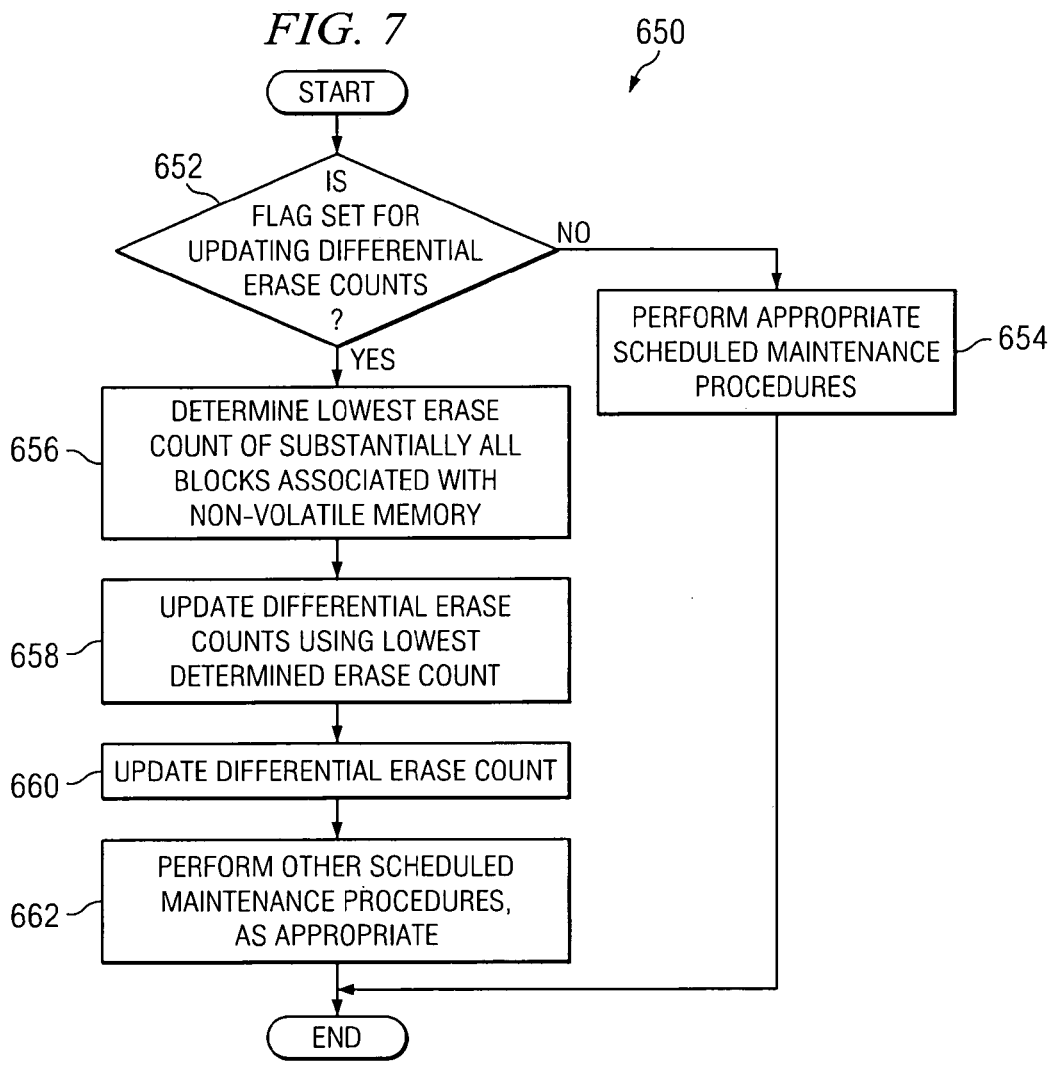
FIG. 7 is a process flow diagram which illustrates the steps associated with processing a differential erase count associated with a physical block during a scheduled maintenance process in accordance with an embodiment of the present invention.

FIG. 7 is a process flow diagram which illustrates the steps associated with processing a differential erase count of a physical block during a scheduled maintenance process in accordance with an embodiment of the present invention. A scheduled maintenance process 650 begins at step 652 in which it is determined whether a flag, e.g., a flag in a power management block, is set to indicate that differential erase counts are to be updated or effectively reset based on a new base value. If it is determined that a flag is not set to indicate that differential erase counts are to be updated, then appropriate scheduled maintenance procedures, as for example scheduled maintenance procedures which do not include updating differential erase counts or updating a differential erase count block, are performed in step 654. Once the appropriate scheduled maintenance procedures are performed, the scheduled maintenance process is completed.

Alternatively, if it is determined in step 652 hat differential erase counts are to be updated, then, in step 656, the lowest actual erase count of substantially all physical blocks associated with the non-volatile memory is determined. That is, the least erased block associated with the non-volatile memory is effectively identified.

It should be appreciated that determining the lowest actual erase count may include obtaining the differential erase count associated with the least erased block, and essentially adding that differential erase count to the previous stored lowest actual erase count. In other words, the lowest differential erase count associated with the non-volatile memory is used to determine the lowest actual erase count associated with the non-volatile memory.

After the lowest actual erase count is determined, the differential erase counts of the physical blocks in the non-volatile memory may be updated in step 658 using the lowest actual erase count. The difference between the lowest actual erase count and the most recent previous stored lowest actual erase count may be determined and then used to effectively adjust the differential erase counts such that the adjusted or updated differential erase counts are effectively the difference between the actual erase counts and the lowest actual erase count. After the differential erase counts are updated, the updated differential erase counts are stored in their associated physical blocks and the differential erase count block. That is, in one embodiment, updating the differential erase counts may include effectively adding the previous stored lowest actual erase count from the differential erase counts, then effectively subtracting the current lowest actual erase count, as determined in step 656, from the differential erase counts. It should be understood, however, that substantially any suitable method may be used to update differential erase counts using the lowest actual erase count.

Once the differential erase counts are updated, the updated differential erase counts may be stored in their respective physical blocks. Then, in step 660, the differential erase count block is updated. Updating the differential erase count block generally involves storing the updated erase counts into appropriate locations within the differential erase count block, and storing the lowest actual erase count, as determined in step 656, in the differential erase count block. Once the differential erase count block is updated, any other scheduled maintenance procedures may be performed, as appropriate, and the process of performing scheduled maintenance is completed.

Figure 8:
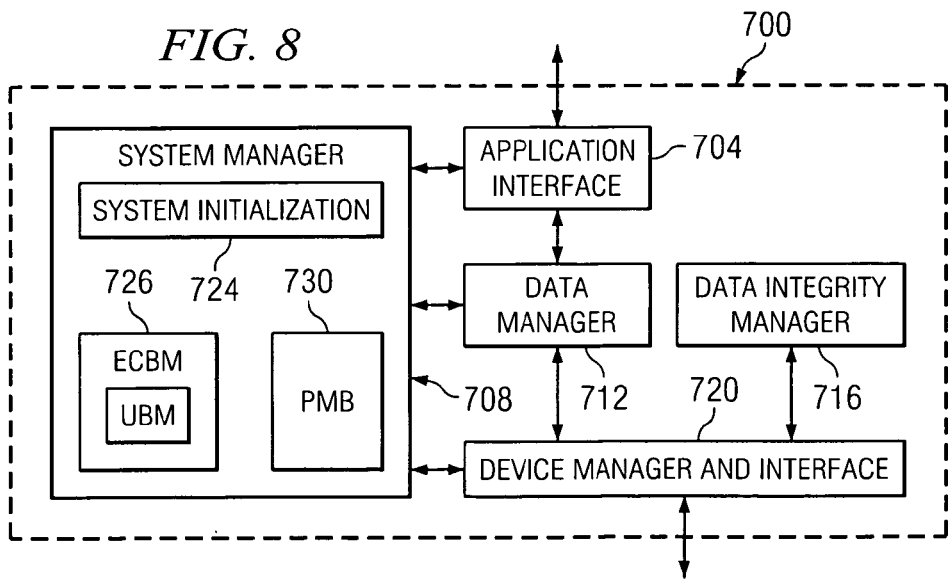
FIG. 8 is a diagrammatic block diagram representation of a system architecture in accordance with an embodiment of the present invention.

In general, the functionality associated with implementing, maintaining, and utilizing differential erase counts and, additionally, a differential erase count block or table, is provided in software, e.g., as program code devices, or as firmware to a host system which includes a non-volatile memory or non-volatile memory component. One embodiment of a suitable system architecture associated with the software or firmware provided to a host system to enable a differential erase count block to be implemented, maintained, and used is shown in FIG. 8. A system architecture 700 generally includes a variety of modules which may include, but are not limited to, an application interface module 704, a system manager module 708, a data manager module 712, a data integrity manager 716, and a device manager and interface module 720. In general, system architecture 700 may be implemented using software code devices or firmware which may be accessed by a processor, e.g., processor 108 of FIG. 1a.

In general, application interface module 704 may be arranged to communicate with the host, operating system or the user directly. Application interface module 704 is also in communication with system manager module 708 and data manager module 712. When the user want to read, write or format the flash memory, it send requests to the operating system, the requests are passed to the Application interface. The Application interface directs the requests to the system manager module 708 or data manager module 712 depending on the requests.

System manager module 708 includes a system initialization submodule 724, an erase count block management submodule 726, and a power management block submodule 730. System initialization submodule 724 is generally arranged to enable an initialization request to be processed, and typically communicates with erase count block management submodule 726. Erase count block management submodule 726 includes functionality to cause erase counts of blocks to be stored, and functionality to cause an average erase count to be calculated, as well as updated, using individual erase counts. The use of erase counts is described in co-pending U.S. patent application Ser. No. 10/281,739, which has been incorporated by reference in its entirety. System initialization module 724 is also arranged to resolve a one-to-many logical-to-physical block assignment and, hence, may utilize update indexes. Power management block submodule 730 may be arranged to enable a power management to be implemented, maintained, and used. By way of example, power management block submodule 730 may be arranged to allocate power management blocks, and to oversee the writing of signatures and other information which may be stored in a power management block.

In addition to being in communication with application interface module 704, system manager module 708 is also in communication with data manager module 712, as well as device manager and interface module 720. Data manager module 712, which communicates with both system manager module 708 and application interface module 704, may include functionality to provide sector mapping which effectively translates logical sectors into physical sectors. That is, data manager module 712 is arranged to map logical blocks into physical blocks. Data manager module 712 may also include functionality associated with operating system and file system interface layers, and enables groups within blocks to be managed, as described in co-pending U.S. patent application Ser. No. 10/281,855, which has been incorporated by reference in its entirety.

Device manager and interface module 720, which is in communication with system manager module 708, data manager 712, and data integrity manager 716, typically provides a flash memory interface, and includes functionality associated with hardware abstractions, e.g., an I/O interface. Data integrity manager module 716 provides ECC handling, among other functions.

Although only a few embodiments of the present invention have been described, it should be understood that the present invention may be embodied in many other specific forms without departing from the spirit or the scope of the present invention. By way of example, the lowest actual erase count has been described as being stored in a differential erase count block. In general, the lowest actual erase count may be stored substantially anywhere within an overall memory system that is readily accessible. Similarly, while an average erase count has been described as also being stored in a differential erase count block, an average erase count may also be stored substantially anywhere within an overall memory system.

While a lowest actual erase count associated with a memory system may be identified by studying a least frequently erased block table, the lowest actual erase count may instead be identified using a differential erase count block. When the differential erase count block is used to identify the lowest actual erase count, the lowest actual erase count may be identified by adding the lowest previous actual erase count, or the "base" which is used to create differential erase counts, to the lowest differential erase count located in the differential erase count block.

An average erase count may either be an actual, e.g., absolute, average erase count or a differential erase count. When an average erase count is a differential erase count, each time differential erase counts and a differential erase count block are updated, the average erase count is generally also updated such that the average erase count is relative to the most recent lowest erase count associated with a system. However, when an average erase count is an actual average erase count, then it is typically not necessary to update the average erase count when differential erase counts and a differential erase count block are updated.

A memory system may use differential erase counts and a differential erase count block substantially all the time. In one embodiment, however, a memory system may use actual erase counts and an actual erase count block until an average erase count reaches a particular threshold. In such an embodiment, when the average erase count reaches the threshold, the memory system may switch from using actual erase counts and an actual erase count block to using differential erase counts and a differential erase count block. It should be appreciated that in some memory systems, the use of actual erase counts and an actual erase count block until, for example, the number of bits required to store the actual erase counts requires the allocation of three bytes may improve the efficiency of the systems. By switching to the use of differential erase counts when the allocation of three bytes would be necessary to store actual erase counts, the overhead associated with calculating differential erase counts may be avoided until the use of differential erase counts is substantially more efficient than the continued use of actual erase counts.

A differential erase count block has generally been described as being a block in which differential erase counts may be stored. A differential erase count block typically includes a number of pages in which the differential erase counts are stored, as well as a header in which information such as an average erase count and a lowest actual erase count may be stored. Substantially any suitable data structure in a system memory of an overall non-volatile memory, however, may be arranged to hold differential erase counts and an average erase count.

When a physical block is determined to be unusable, i.e., when a physical block is identified as either having a growing defect or a factory defect, an indication that the physical block is unusable may be stored in a differential erase count block. For example, an indicator or bits which identify that a particular physical block is not usable may be stored in a differential erase count block in a location that corresponds to the particular physical block in lieu of a differential erase count for the particular physical block.

In one embodiment, a differential erase count block may include substantially only entries which correspond to differential erase counts of blocks within a non-volatile memory system. In such an embodiment, information such as a lowest actual erase count and an average erase count, which may typically be contained in a header of a differential erase count block, may be stored in a data structure or a block that is separate from the differential erase count block. That is, a differential erase count block may be arranged substantially only to contain entries pertaining to differential erase counts associated with blocks. Alternatively, in lieu of being stored in a header of a differential erase count block, a lowest actual erase count as well as an average erase count may instead be stored substantially anywhere within a differential erase count block.

The steps associated with the various methods of the present invention may be widely varied. In general, steps may be added, removed, reordered, and altered without departing from the spirit or the scope of the present invention. By way of example, once a differential erase count has been updated, the differential erase count has been described as being stored in both a physical block associated with the differential erase count and in a differential erase count block. In lieu of storing the differential erase count in both the differential erase count block and a physical block that corresponds to the differential erase count, the differential erase count may be stored substantially only in the differential erase count block. Therefore, the present examples are to be considered as illustrative and not restrictive, and the invention is not to be limited to the details given herein, but may be modified within the scope of the appended claims.

What is claimed is:

1. A method for maintaining a data structure associated with a non-volatile memory system, the data structure being arranged to store contents relating to usage of a plurality of physical blocks included in the non-volatile memory system, the method comprising:

determining when it is appropriate to update the contents stored in the data structure;

obtaining at least a first differential erase count from the data structure when it is determined that it is appropriate to update the contents stored in the data structure, the first differential erase count being a plurality of bits arranged to provide information relating to a number of times a first physical block of the plurality of physical blocks has been erased;

determining a first actual erase count when it is determined that it is appropriate to update the contents stored in the data structure, the first actual erase count being associated with a second physical block of the plurality of physical blocks, wherein the first actual erase count is a plurality of bits arranged to provide a number of times the second physical block has been erased; and updating the first differential erase count when it is determined that it is appropriate to update the contents stored in the data structure, wherein updating the first differential erase count includes using the first actual erase count.

2. The method of claim 1 further including:

identifying a first stored actual erase count associated with the non-volatile memory system when it is determined that it is appropriate to update the contents stored in the data structure, wherein updating the first differential erase count when it is determined that it is appropriate to update the contents stored in the data structure includes processing the first differential erase count, the first actual erase count, and the first stored actual erase count to create the updated first differential erase count.

3. The method of claim 2 wherein the first stored actual erase count is a stored lowest actual erase count, the stored lowest actual erase count being a previous lowest actual erase count associated with the plurality of physical blocks.

4. The method of claim 2 wherein the first actual erase count is a current lowest actual erase count associated with the plurality of physical blocks.

5. The method of claim 1 wherein determining when it is appropriate to update the contents stored in the data structure includes obtaining a first value and a comparison value, comparing the first value and the comparison value to determine if the first value is substantially equal to the comparison value, and updating the contents stored in the data structure when it is determined that the first value is substantially equal to the comparison value.

6. The method of claim 5 wherein the first value is an average erase count associated with the plurality of blocks.

7. The method of claim 1 further including:
storing the updated first differential erase count in the data structure; and
storing the first actual erase count in the non-volatile memory system.

8. A memory system comprising:
a non-volatile memory, the non-volatile memory including a plurality of physical blocks and a data structure, the data structure being arranged to store contents relating to usage of the plurality of physical blocks;
means for determining when it is appropriate to update the contents stored in the data structure;
means for obtaining at least a first differential erase count from the data structure when it is determined that it is appropriate to update the contents stored in the data structure, the first differential erase count being a plurality of bits arranged to provide information relating to a number of times a first physical block of the plurality of physical blocks has been erased;
means for determining a first actual erase count when it is determined that it is appropriate to update the contents stored in the data structure, the first actual erase count being associated with a second physical block of the plurality of physical blocks, wherein the first actual erase count is a plurality of bits arranged to provide a number of times the second physical block has been erased; and
means for updating the first differential erase count when it is determined that it is appropriate to update the contents stored in the data structure, wherein the means for updating the first differential erase count include means for using the first actual erase count.

9. The memory system of claim 8 further including:
means for identifying a first stored actual erase count associated with the memory system when it is determined that it is appropriate to update the contents stored in the data structure, wherein the means for updating the first differential erase count when it is determined that it is appropriate to update the contents stored in the data structure include means for processing the first differential erase count, the first actual erase count, and the first stored actual erase count to create the updated first differential erase count.

10. The memory system of claim 9 wherein the first stored actual erase count is a stored lowest actual erase count, the stored lowest actual erase count being a previous lowest actual erase count associated with the plurality of physical blocks.

11. The memory system of claim 9 wherein the first actual erase count is a current lowest actual erase count associated with the plurality of physical blocks.

12. The memory system of claim 1 wherein the means for determining when it is appropriate to update the contents stored in the data structure include means for obtaining a first value and a comparison value, means for comparing the first value and the comparison value to determine if the first value is substantially equal to the comparison value, and means for updating the contents stored in the data structure when it is determined that the first value is substantially equal to the comparison value.

13. The memory system of claim 12 wherein the first value is an average erase count associated with the plurality of blocks.

14. The memory system of claim 8 further including:
means for storing the updated first differential erase count in the data structure; and
means for storing the first actual erase count in the memory system.

15. The memory system of claim 8 wherein the memory system is one of an embedded system, a Smart Media card, a Compact Flash card, a Secure Digital Card, and a Multi-Media card.

16. A memory system comprising:
a non-volatile memory, the non-volatile memory including a plurality of physical blocks and a data structure, the data structure being arranged to store contents relating to usage of the plurality of physical blocks;
code devices that cause a determination of when it is appropriate to update the contents stored in the data structure;
code devices that cause at least a first differential erase count to be obtained from the data structure when it is determined that it is appropriate to update the contents stored in the data structure, the first differential erase count being a plurality of bits arranged to provide information relating to a number of times a first physical block of the plurality of physical blocks has been erased;
code devices that cause a determination of a first actual erase count when it is determined that it is appropriate to update the contents stored in the data structure, the first actual erase count being associated with a second physical block of the plurality of physical blocks, wherein the first actual erase count is a plurality of bits arranged to provide a number of times the second physical block has been erased;
code devices that cause the first differential erase count to be updated when it is determined that it is appropriate to update the contents stored in the data structure, wherein the means for updating the first differential erase count include means for using the first actual erase count; and
a computer readable medium that stores the code devices.

17. The memory system of claim 16 further including:
code devices that cause a first stored actual erase count associated with the memory system to be identified when it is determined that it is appropriate to update the contents stored in the data structure, wherein the code devices that cause the first differential erase count to be updated when it is determined that it is appropriate to update the contents stored in the data structure include code devices that cause the first differential erase count, the first actual erase count, and the first stored actual erase count to be processed to create the updated first differential erase count.

18. The memory system of claim 17 wherein the first stored actual erase count is a stored lowest actual erase count, the stored lowest actual erase count being a previous lowest actual erase count associated with the plurality of physical blocks.

19. The memory system of claim 17 wherein the first actual erase count is a current lowest actual erase count associated with the plurality of physical blocks.

20. The memory system of claim 16 wherein the code devices that cause the determination of when it is appropriate to update the contents stored in the data structure include code devices that cause a first value and a comparison value to be obtained, code devices that cause the first value and the comparison value to be compared determine if the first value is substantially equal to the comparison value, and code devices that cause the contents stored in the data structure to be updated when it is determined that the first value is substantially equal to the comparison value.

21. The memory system of claim 20 wherein the first value is an average erase count associated with the plurality of blocks.

22. The memory system of claim 16 further including:
code devices that cause the updated first differential erase count to be stored in the data structure; and
code devices that cause the first actual erase count to be stored in the memory system.

23. The memory system of claim 16 wherein the memory system is one of an embedded system, a Smart Media card, a Compact Flash card, a Secure Digital Card, and a Multi-Media card.

24. A method for tracking the life remaining for a first physical block, the first physical block being one of a plurality of physical blocks included in a non-volatile memory system, the method comprising:
obtaining a differential erase count associated with the first physical block, the differential erase count being arranged to substantially express a difference between a number of times the first physical block has been erased and a first value;
incrementing the differential erase count; and
storing the differential erase count.

25. The method of claim 24 wherein obtaining the differential erase count includes obtaining the differential erase count from a differential erase count block of the non-volatile memory system, and storing the differential erase count includes storing the differential erase count in at least one of the differential erase count block and the first physical block.

26. The method of claim 24 further including:
obtaining an average erase count associated with the non-volatile memory system, the average erase count being arranged to indicate an average number of times the plurality of physical blocks has been erased; and
comparing the average erase count with a second value to determine when the average erase count is substantially equal to the second value, wherein when it is determined that the average erase count is substantially equal to the second value, the method still further includes updating the differential erase count after the differential erase count is obtained.

27. The method of claim 26 wherein updating the differential erase count includes:
identifying a third value; and
modifying the differential erase count to substantially express the difference between the number of times the first physical block has been erased and the third value before storing the differential erase count.

28. The method of claim 27 wherein the first value is a previous lowest actual erase count associated with the non-volatile memory system, the previous lowest actual erase count being arranged to indicate a previous fewest number of times one of the plurality of physical blocks has been erased, and wherein the third value is a current lowest actual erase count associated with the non-volatile memory system, the current lowest actual erase count being arranged to indicate a current fewest number of times one of the plurality of physical blocks has been erased.

29. A system comprising:
a non-volatile memory, the non-volatile memory including a plurality of physical blocks, the plurality of physical blocks including a first physical block;
code devices for obtaining a differential erase count associated with the first physical block, the differential erase count being arranged to substantially express a difference between a number of times the first physical block has been erased and a first value;
code devices for incrementing the differential erase count;
code devices for storing the differential erase count; and
a medium that stores the code devices.

30. The system of claim 29 wherein the code devices for obtaining the differential erase count include code devices for obtaining the differential erase count from a differential erase count block of the non-volatile memory system, and code devices for storing the differential erase count includes storing the differential erase count in at least one of the differential erase count block and the first physical block.

31. The system of claim 29 further including:
code devices for obtaining an average erase count associated with the non-volatile memory system, the average erase count being arranged to indicate an average number of times the plurality of physical blocks has been erased; and
code devices for comparing the average erase count with a second value to determine when the average erase count is substantially equal to the second value, wherein when it is determined that the average erase count is substantially equal to the second value, the system includes code devices for updating the differential erase count after the differential erase count is obtained.

32. The system of claim 31 wherein the code devices for updating the differential erase count include:
code devices for identifying a third value; and
code devices for modifying the differential erase count to substantially express the difference between the number of times the first physical block has been erased and the third value before storing the differential erase count.

33. The system of claim 32 wherein the first value is a previous lowest actual erase count associated with the non-volatile memory system, the previous lowest actual erase count being arranged to indicate a previous fewest number of times one of the plurality of physical blocks has been erased, and wherein the third value is a current lowest actual erase count associated with the non-volatile memory system, the current lowest actual erase count being arranged to indicate a current fewest number of times one of the plurality of physical blocks has been erased.

34. The system of claim 29 wherein the system is one of an embedded system, a Smart Media card, a Compact Flash card, a Secure Digital Card, and a MultiMedia card.

* * * * *